US011257466B2

(12) United States Patent
Huang et al.

(10) Patent No.: US 11,257,466 B2
(45) Date of Patent: Feb. 22, 2022

(54) MOBILE TERMINAL AND DISPLAY METHOD THEREOF

(71) Applicant: HUAWEI TECHNOLOGIES CO., LTD., Shenzhen (CN)

(72) Inventors: Bo Huang, Shanghai (CN); Yufei Sun, Shanghai (CN); Haiming He, Dongguan (CN); Hongchao Leng, Shanghai (CN); Peng Ding, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/971,721

(22) PCT Filed: Feb. 26, 2018

(86) PCT No.: PCT/CN2018/077289
§ 371 (c)(1),
(2) Date: Aug. 21, 2020

(87) PCT Pub. No.: WO2019/161571
PCT Pub. Date: Aug. 29, 2019

(65) Prior Publication Data
US 2020/0394983 A1    Dec. 17, 2020

(51) Int. Cl.
*G09G 5/14* (2006.01)
*G06F 3/16* (2006.01)
(Continued)

(52) U.S. Cl.
CPC .............. *G09G 5/14* (2013.01); *G06F 3/16* (2013.01); *G09G 3/3216* (2013.01);
(Continued)

(58) Field of Classification Search
CPC ...... G09G 5/14; G09G 3/3216; G09G 3/3225; G09G 3/20; G09G 2354/00;
(Continued)

(56) References Cited

U.S. PATENT DOCUMENTS

2014/0192090 A1* 7/2014 Park ...................... G06F 3/0481
345/672
2014/0327841 A1* 11/2014 Shin ...................... H01L 27/323
349/12

(Continued)

FOREIGN PATENT DOCUMENTS

CN          104332487 A      2/2015
CN          106850898 A      6/2017
(Continued)

*Primary Examiner* — Brent D Castiaux
(74) *Attorney, Agent, or Firm* — Maier & Maier, PLLC

(57) ABSTRACT

A mobile terminal and a display method are disclosed. The mobile terminal, including an enclosure, a display module, and one or more devices. The display module includes a first display region and a second display region. Both the first display region and the second display region are capable of displaying information. At least one of the one or more devices is disposed between the display module in the second display region and the enclosure. At least one of the one or more devices is capable of transmitting and/or receiving an optical signal through the display module. At least one transparent display region is disposed, so that a device disposed in the region is allowed to transmit and receive an optical signal through the display module. The mobile terminal integrates non-transparent display and transparent display functions.

20 Claims, 17 Drawing Sheets

(51) Int. Cl.
  *G09G 3/3216* (2016.01)
  *G09G 3/3225* (2016.01)
  *H01L 27/32* (2006.01)
  *G10L 15/22* (2006.01)
  *H01L 51/52* (2006.01)
  *G06F 3/041* (2006.01)

(52) U.S. Cl.
  CPC ............ *G09G 3/3225* (2013.01); *G10L 15/22* (2013.01); *H01L 27/323* (2013.01); *H01L 27/3234* (2013.01); *H01L 27/3267* (2013.01); *H01L 27/3286* (2013.01); *H01L 51/5203* (2013.01); *H01L 51/524* (2013.01); *G06F 3/041* (2013.01); *G09G 2354/00* (2013.01); *G10L 2015/223* (2013.01); *H01L 2251/301* (2013.01)

(58) Field of Classification Search
  CPC ..... G09G 2300/023; G06F 3/16; G06F 3/041; G06F 3/167; G10L 15/22; G10L 2015/223; H01L 27/323; H01L 27/3234; H01L 27/3267; H01L 27/3286; H01L 51/5203; H01L 51/524; H01L 2251/301
  See application file for complete search history.

(56) References Cited

U.S. PATENT DOCUMENTS

| | | | |
|---|---|---|---|
| 2015/0241925 A1* | 8/2015 | Seo ...................... | G06F 1/1681 |
| | | | 361/679.27 |
| 2016/0011689 A1* | 1/2016 | Kim ...................... | G06F 3/0446 |
| | | | 345/173 |
| 2016/0211450 A1* | 7/2016 | Song ................... | H01L 27/3267 |
| 2018/0129328 A1* | 5/2018 | Park ...................... | G06F 1/3231 |
| 2018/0191437 A1* | 7/2018 | Cha ...................... | H04B 10/516 |
| 2018/0260079 A1* | 9/2018 | Zhang ................... | G06F 1/1652 |
| 2018/0314873 A1 | 11/2018 | Yang et al. | |

FOREIGN PATENT DOCUMENTS

| | | |
|---|---|---|
| CN | 106878564 A | 6/2017 |
| CN | 107102693 A | 8/2017 |
| WO | 2017/119619 A1 | 7/2017 |

\* cited by examiner

MOBILE TERMINAL AND DISPLAY METHOD THEREOF

CROSS-REFERENCE TO RELATED APPLICATIONS

This application is a National Stage of International Application No. PCT/CN2018/077289, filed on Feb. 26, 2018, which is hereby incorporated by reference in its entirety.

TECHNICAL FIELD

This application relates to the field of display technologies, and in particular, to a mobile terminal and a display method of the mobile terminal.

BACKGROUND

Fast development of electronic technologies enables use of various types of display screens in many fields. However, existing mobile terminals usually provide non-transparent display. With development of display technologies, displaying an image on a transparent object becomes one of fashion trends. A transparent television is already available in the industry of home appliances. However, a transparent display apparatus usually uses only one transparent display screen for transparent display, thereby providing a single display effect.

SUMMARY

A technical issue to be resolved in embodiments of this application is to provide a mobile terminal and a display method thereof, so as to provide a local transparent display function.

To achieve the foregoing objective, the following technical solutions are used in implementations of this application.

According to a first aspect, an embodiment of this application provides a mobile terminal, including an enclosure, a display module, and one or more devices. The display module includes a first display region and a second display region. Both the first display region and the second display region are capable of displaying information. At least one of the one or more devices is disposed between the display module in the second display region and the enclosure. At least one of the one or more devices is capable of transmitting and/or receiving an optical signal through the display module.

For example, the display module of the mobile terminal includes at least two display regions, and all the at least two display regions are capable of displaying the information of the mobile terminal. At least one of the display regions is a non-transparent display region, and at least one of the display regions is a transparent display region. The transparent display region is a display region under which a device disposed can be seen through the display module. The device disposed under the transparent display region is capable of transmitting and receiving an optical signal through the transparent display region of the display module. The device disposed under the transparent display region may be an optical device such as a camera or an optical sensor.

In this embodiment of this application, the so-called "transparent" may be understood as "fully transparent", "semi-transparent", or "partially transparent", that is, all materials with a natural light transmittance proportion of 50%-99%, for example, 60%, 80%, 90%, or 95%, may be understood as being included in the idea scope of this application.

According to the mobile terminal provided in this embodiment of this application, at least one transparent display region is disposed, so that the information of the mobile terminal can be displayed, and the devices disposed under the region are allowed to transmit and receive an optical signal through the display module. The mobile terminal integrates non-transparent display and transparent display functions. A surface region of a device, of the mobile terminal, that requires light transmission is properly disposed, and a screen-to-body ratio for display on the mobile terminal is increased, to implement a full-screen display effect. In addition, a display effect is enriched, and user experience is improved.

In addition, because the second display region is disposed, a function of a device disposed behind the display module, for example, a function of a device such as a camera, an optical transmitter, an optical receiver, or an indicator, is not affected. For example, in some use scenarios of the mobile terminal, the second display region may display information; and in other use scenarios of the mobile terminal, the second display region may transmit light, without affecting operating of a device under the second display region. For example, a camera takes a photo, or an optical proximity sensing device implements a proximity sensing function, or an indicator implements a function of displaying a reminder light.

Further, for a full-screen mobile terminal such as a full-screen mobile phone, because the second display region is disposed, the display module does not require a structure such as a via or a groove to reserve space for the device. When a user drops or hits the mobile terminal with the display module, the display module is not subject to cracking or damage, thereby improving reliability of the display module and extending a service life of the display module. In addition, because the display module does not require the structure such as the via or the groove, a screen-to-body ratio is increased, a manufacturing process of the display module is simplified, and a yield rate of the display module is also improved.

In an implementation, the display module includes a first display screen and a second display screen that are disposed in an overlay manner. The first display screen is a transparent display screen. The first display screen includes a first connection part and a second connection part disposed in a connection to the first connection part. The first connection part is located in the second display region. The second connection part is located in the first display region. The second display screen is attached to the second connection part.

The first display screen is located in the first display region and the second display region. The first display screen implements a local transparent display effect in the second display region, thereby enriching functionality of the display module and also improving user experience.

In an implementation, the display module further includes a transparent cover, and the transparent cover, the first display screen, and the second display screen are sequentially disposed in an overlay manner. The transparent cover is capable of protecting the first display screen and the second display screen, to avoid damage to the first display screen and the second display screen.

In an implementation, the display module includes at least two display screens. The at least two display screens are mutually spliced to form a complete display interface. At least one display screen is a transparent display screen. The transparent display screen is corresponding to the second display region. This implements a transparent display function of the display module while reducing a thickness of the display module and also reducing component costs and fitting costs of the display module.

In an implementation, the at least two display screens include a first display screen and a second display screen, and the display module further includes a transparent cover. The first display screen and the second display screen are attached to the transparent cover side by side. The first display screen is a transparent display screen. The first display screen and the second display screen are disposed with a spacing to form a gap.

Because the first display screen and the second display screen are attached to the transparent cover side by side, the transparent cover is capable of protecting the first display screen and the second display screen, to avoid damage to the first display screen and the second display screen. The first display screen is a transparent display screen, and the first display screen implements a local transparent display function of the display module. The gap is processing space reserved for attaching the first display screen and the second display screen to the transparent cover side by side, so as to route a wire and/or apply an adhesive.

In an implementation, a region, on the transparent cover, corresponding to the gap forms a blocking region. The blocking region is configured to block the gap, making the mobile terminal more beautiful and therefore improving use experience of a user.

In an implementation, the second display screen is a flexible display screen, to provide curved-surface display. Further, because the second display screen is a flexible display screen, the second display screen can be well attached to the first display screen. In another implementation, the second display screen may alternatively be a rigid display screen, for example, a rigid OLED display screen, an AMOLED, or an LCD display screen.

In an implementation, the display module includes one display screen. The display screen includes a first display part and a second display part disposed in a connection to the first display part. The first display part is disposed in correspondence to the first display region. The first display part includes a plurality of first electrodes. The second display part includes a plurality of second electrodes. Transmittance of the first electrode is greater than transmittance of the second electrode.

In this implementation, transparent electrodes made of different materials are disposed in different regions on a same display screen, to implement different display effects of the display module. This improves functionality of the mobile terminal and reduces a thickness of the mobile terminal.

In an implementation, the second display region is encircled by the first display region, and the first display part is encircled by the second display part, thereby enriching display modes of the mobile terminal. In the mobile terminal, virtual keys may be disposed in regions corresponding to both sides of the first display region. The virtual keys, for example, special functional keys such as a volume key and an on/off key, are covered by the second display region. Alternatively, a strobe light may be disposed. The strobe light is covered by the second display region. When the mobile terminal is in a photographing scenario, the strobe light turns on, to improve brightness of ambient light and therefore improve photographing/video recording quality and user experience. In the second display region corresponding to a bottom of the first display region, a user can see an internal device of the mobile terminal.

In an implementation, a material of the first electrode includes at least one of graphene, a carbon nanotube, and a silver nanowire. The graphene, the carbon nanotube, and the silver nanowire have high transmittance. For example, the graphene material can transmit 98% of light. This can greatly improve transparency of the display module in the second display region, so that the display module has a quite good transparent display effect.

In an implementation, a material of the second electrode includes indium tin oxide.

In an implementation, the one or more devices include at least one processor. The at least one processor is electrically connected to the display module. The at least one processor controls and adjusts a work status of the display module in the first display region and a work status of the display module in the second display region.

According to a second aspect, an embodiment of this application provides a display method using the foregoing mobile terminal, including:

in a first status, displaying, by the display module, information of the mobile terminal in the first display region and the second display region; and in a second status, skipping displaying, by the display module, information of the mobile terminal in at least a part of the second display region, so that the device disposed under the second display region transmits and/or receives an optical signal through the display module in the second display region.

For example, when the mobile terminal lights up a screen and displays a home screen, the display module displays the information of the mobile terminal, for example, a background of the home screen, an application icon, and a reminder icon, in the first display region and the second display region. When the mobile terminal performs photographing by using a front camera disposed under the display module in the second display region, a region, in the second display region, corresponding to the front camera does not display information, and is in a light transmission state, so that the front camera can capture an image. The captured image may be displayed in the first display region.

According to the foregoing enclosure, display module, and one or more devices, the one or more devices further include at least one processor. The at least one processor is configured to control and adjust a work status of the display module in the first display region and a work status of the display module in the second display region.

The display module of the mobile terminal has the second display region and the first display region, and integrates transparent display and non-transparent display functions, thereby enhancing functionality and a display effect of the mobile terminal, and further improving user experience. Based on different use scenarios of the mobile terminal, the processor controls and adjusts the work status of the display module in the first display region and the work status of the display module in the first display region, thereby improving functionality and convenience of the mobile terminal. In some use scenarios, the processor controls the second display region and the first display region to simultaneously enter a screen-on state and display image information. In other use scenarios of the mobile terminal, the processor controls the second display region to enter a screen-off state without display, and controls the first display region to display information.

In an implementation, at least one device is disposed in correspondence to the second display region. For example, a camera takes a photo, or an optical proximity sensing device implements a proximity sensing function, or an indicator implements a function of displaying a reminder light. In addition, because the second display region is disposed for the display module and the device is disposed in correspondence to the second display region, no structure such as a via or a groove is required for reserving space for the device. When a user drops or hits the mobile terminal, the mobile terminal is not subject to cracking or damage, thereby improving reliability of the mobile terminal and extending a service life of the mobile terminal. In addition, because the mobile terminal does not require the structure such as the via or the groove, a manufacturing process of the display module is simplified, and a yield rate of the display module is also improved.

In an implementation, in response to a trigger event, the at least one processor controls the display module to switch from a first work status to a second work status in the second display region. For example, the first work status is a semi-transparent display state, and the second work status is a transparent state. The second display region can display an image, for example, time and weather, in the semi-transparent display state, and the second display region has a perspective effect in the transparent state, thereby implementing a special effect of the mobile terminal that a perspective effect and content display appear alternately, or the like, and enriching functions of the mobile terminal.

In an implementation, the trigger event is that a function of the at least one device disposed in correspondence to the second display region is enabled or disabled. Because the work status of the second display region is controlled based on enabling or disabling of the device, intelligence and use convenience of the mobile terminal are enhanced. In addition, the second display region can hide a device, of the mobile terminal, disposed behind the second display region, without affecting image display; and does not affect use of the device when a function of the device is enabled or disable, thereby facilitating use. For example, the device is a camera. When the mobile terminal is in a photographing application scenario, a photographing function of the camera is enabled, the second display region switches to the transparent state, and the camera is shown in the second display region without affecting photographing. When the camera does not need to be used, the second display region switches to a display state, and the camera is hidden in the second display region.

In an implementation, the second display region includes at least two mutually connected transparent sub-regions, and the processor controls a work status of the transparent sub-regions. The work status of the transparent sub-regions is controlled and adjusted based on different use scenarios of the mobile terminal, to facilitate use of a user. For example, in a use scenario of the mobile terminal, one of the transparent sub-regions enters a screen-on state for display, and remaining transparent sub-regions may be in a transparent state with screens off and no information displayed. However, in some other use scenarios, all transparent sub-regions enter a screen-off state or enter a screen-on state for display. For another example, one device is disposed in correspondence to one transparent sub-region. When a function of the device is enabled, the transparent sub-region corresponding to the device enters a screen-off state without displaying information, and is in a light transmission state, without affecting use of the function of the device. When the function of the device is disabled, the transparent sub-region corresponding to the device enters a screen-on state to display information.

In an implementation, the terminal apparatus further includes a top region. The second display region is located in the top region, so that the display module does not need to reserve space (for example, by using a structure such as a via or a groove) in the top region for the device.

In an implementation, the mobile terminal further includes a voice collection apparatus disposed in the enclosure. The processor identifies a voice collected by the voice collection apparatus, and controls the display module to display an image in the second display region, thereby enhancing human-computer interaction and improving use experience and convenience for a user.

In an implementation, at least some structures of a region, of the mobile terminal, corresponding to the second display region are transparent structures. In this way, at least some structures of the mobile terminal are completely transparent structures, thereby improving functionality of the mobile terminal.

In an implementation, the mobile terminal includes a front side. A display side of the display module is distributed in an entire region of the front side, thereby implementing a high screen-to-body ratio and improving use experience of a user.

DETAILED DESCRIPTION

Embodiments of the invention provide a mobile terminal, including an enclosure, a display module, and one or more devices. The display module includes a first display region and a second display region. Both the first display region and the second display region are capable of displaying information of the mobile terminal. At least one of the one or more devices is disposed between the display module in the second display region and the enclosure. At least one of the one or more devices is capable of transmitting and/or receiving an optical signal through the display module.

For example, the display module of the mobile terminal includes at least two display regions, and all the at least two display regions are capable of displaying the information of the mobile terminal. At least one of the display regions is a non-transparent display region, and at least one of the display regions is a transparent display region. The transparent display region is a display region under which a device disposed can be seen through the display module. The device disposed under the transparent display region is capable of transmitting and receiving an optical signal through the transparent display region of the display module. The device disposed under the transparent display region may be an optical device such as a camera or an optical sensor.

Figure 1A:
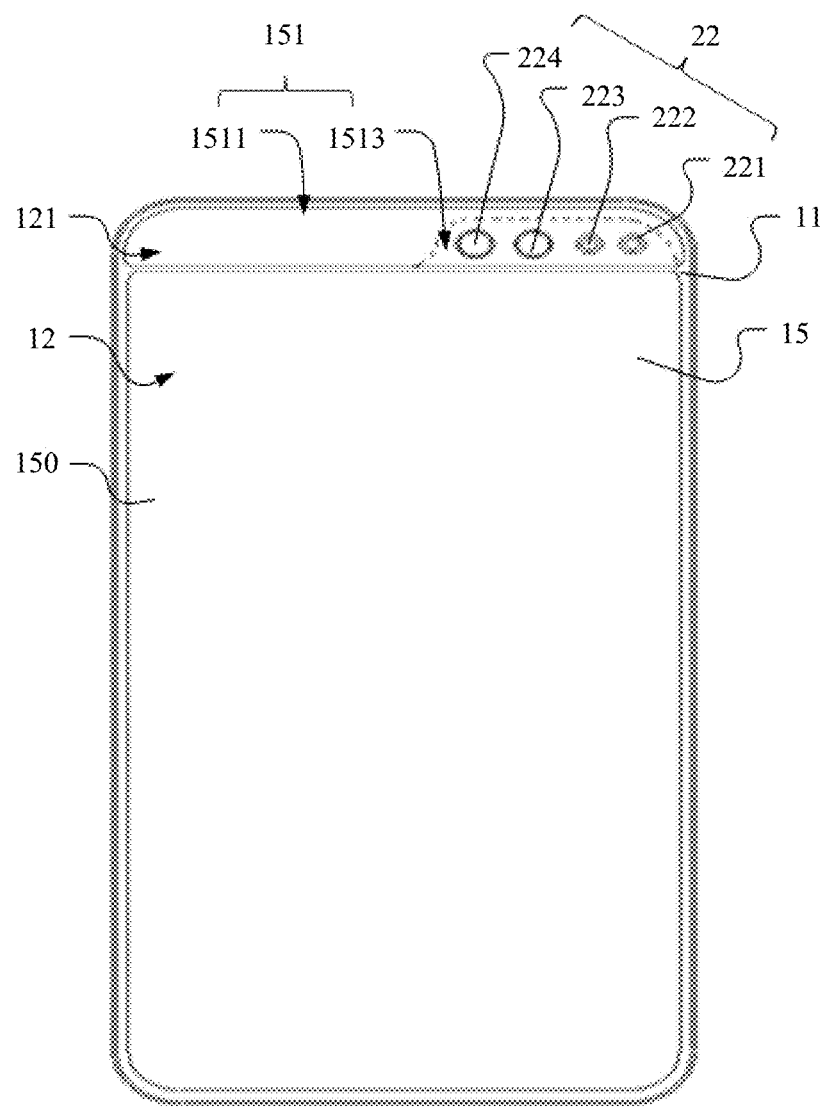
FIG. 1A is a schematic diagram of a mobile terminal according to an embodiment.
Figure 1B:
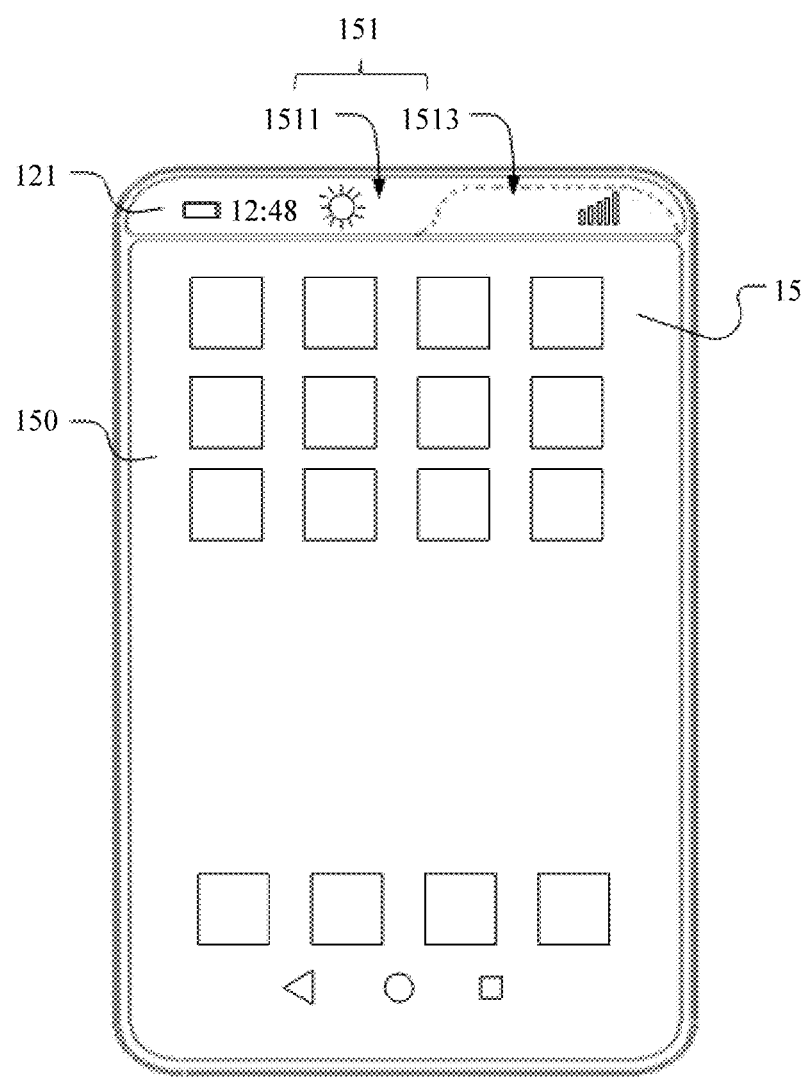
FIG. 1B is a diagram of a display interface of the mobile terminal shown in FIG. 1A.
Figure 1C:
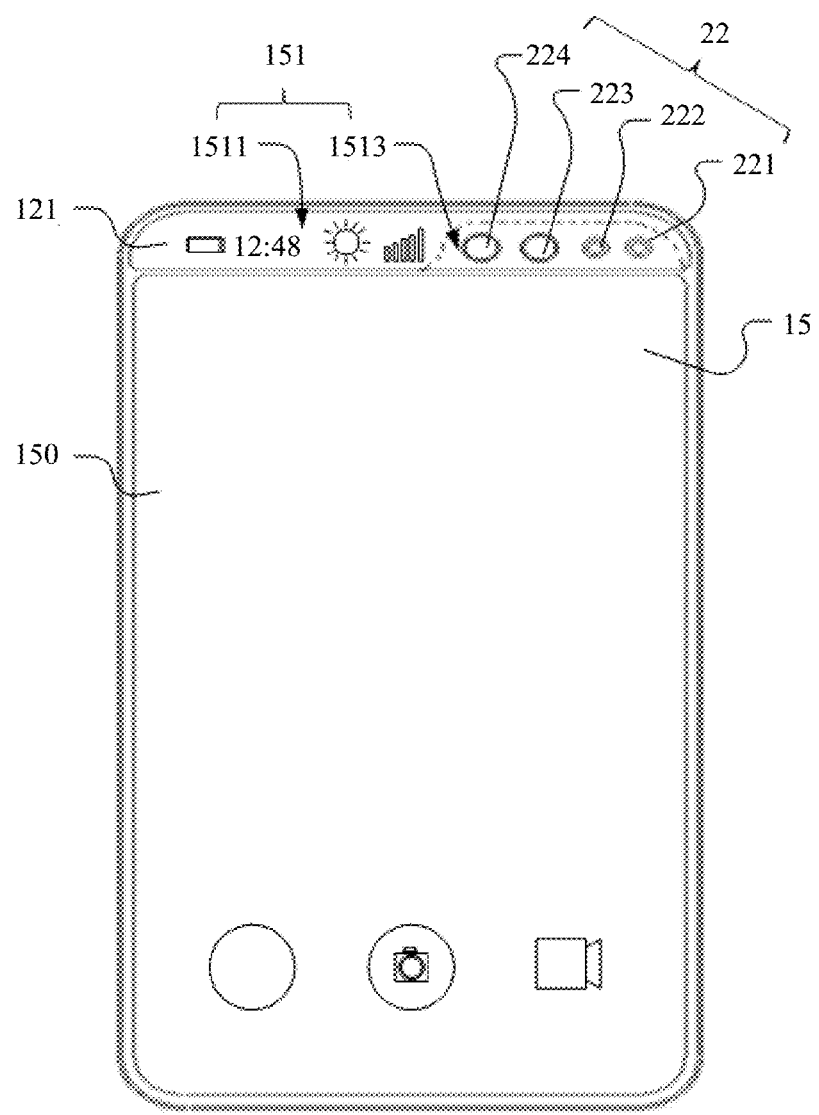
FIG. 1C is a diagram of another display interface of the mobile terminal shown in FIG. 1.

FIG. 1A, FIG. 1B, and FIG. 1C are schematic diagrams of a mobile terminal 10 according to a first implementation. The mobile terminal 10 includes an enclosure 11, a display module 15, and one or more devices 22. The display module 15 is disposed in the enclosure 11. At least one of the one or more devices 22 is disposed between the display module 15 and the enclosure 11. At least one of the one or more devices 22 is capable of transmitting and/or receiving an optical signal through the display module 15. The enclosure 11 is configured to protect the display module 15 and the other devices 22 of the mobile terminal 10.

Figure 2:
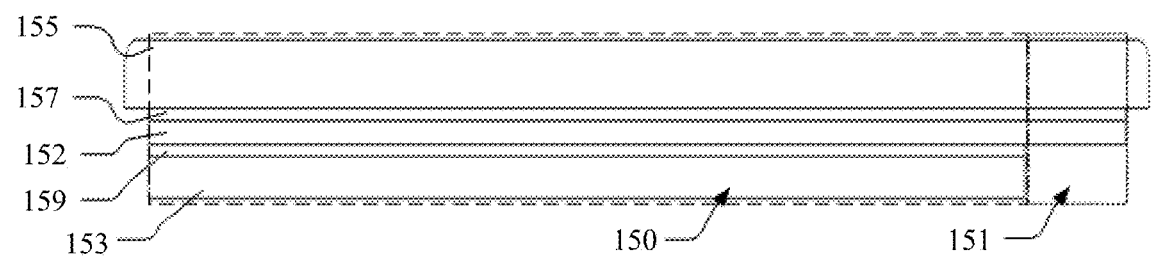
FIG. 2 is a side view of a display module according to an embodiment.

FIG. 2 is a side view of the display module 15 according to the first implementation. The display module 15 includes a first display region 150 and a second display region 151 disposed in a connection to the first display region 150. Both the first display region 150 and the first display region 150 are capable of displaying information of the mobile terminal 10. The first display region 150 is a non-transparent display region. The second display region 151 is a transparent display region. The second display region 151 allows a user to see a real object through the second display region 151. The so-called "transparent" may be understood as "fully transparent", "semi-transparent", or "partially transparent", that is, all materials with a natural light transmittance proportion of 50%-99%, for example, 60%, 80%, 90%, or 95%, may be understood as being included in the idea scope of this application. The transparent display region is a display region under which a device disposed can be seen through the display module 15.

In this implementation, the mobile terminal 10 is a full-screen mobile phone. A side, of the mobile terminal 10, on which the display module 15 is disposed is defined as a front side 12. A side, of the display module 15, used for display is a display side, that is, a side that a user can view is the display side. The mobile terminal 10 includes a rear side (not shown in the figure) disposed opposite to the front side 12. Display sides of the first display region 150 and the second display region 151 of the display module 15 are distributed on an entire region of the front side 12 of the mobile terminal 10. It can be understood that the mobile terminal 10 is not limited to a full-screen mobile phone, and may alternatively be a non-full-screen mobile phone. Alternatively, the mobile terminal 10 may be a tablet computer, a reader, a wearable device, or the like. The mobile terminal 10 further includes another structure, for example, a main board. Details are not described herein for the sake of brevity.

In some embodiments, the display module 15 includes a first display screen 152 and a second display screen 153 that are disposed in an overlay manner. The first display screen 152 is a transparent display screen. An area of the first display screen 152 is larger than an area of the second display screen 153, to form the second display region 151. The second display region 151 is made of a light-transmissive material. Transmittance of the material of the second display region 151 is 50%-99%, for example, 60%, 80%, 90%, or 95%.

Figure 3:
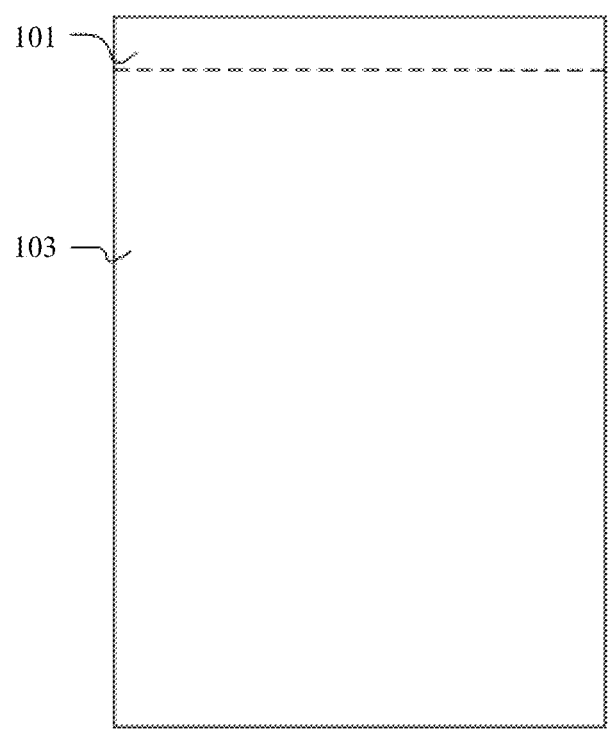
FIG. 3 is a schematic plan view of a first display screen according to an embodiment.

Further, FIG. 3 is a schematic plan view of the first display screen 152 according to the first implementation. The first display screen 152 includes a first connection part 101 and a second connection part 103 disposed in a connection to the first connection part 101. The first connection part 101 is disposed in correspondence to the second display region 151, and is used for transparent display. The first connection part 101 is made of a light-transmissive material. The second display screen 153 is attached to the second connection part 103. The second display screen 153 and the second connection part 103 are disposed in correspondence to the first display region 150. In other words, a region, of the display module 15, corresponding to the first connection part 101 forms the second display region 151, and a region, of the display module 15, corresponding to the second display screen 153 forms the first display region 150. In this implementation, an area of the first connection part 101 is smaller than an area of the second connection part 103, and the area of the second connection part 103 is the same as an area of the second display screen 153, so that the first display region 150 serves as a primary display region of the mobile terminal 10, and the second display region 151 serves as a secondary display region of the mobile terminal 10. A resolution of the second display screen 151 is higher than that of the first display screen 152, to improve a resolution and a display effect of the mobile terminal 10. The second display screen 153 is a flexible display screen, to provide curved-surface display. Further, because the second display screen 153 is a flexible display screen, the second display screen 153 can be well attached to the first display screen 152.

Figure 4:
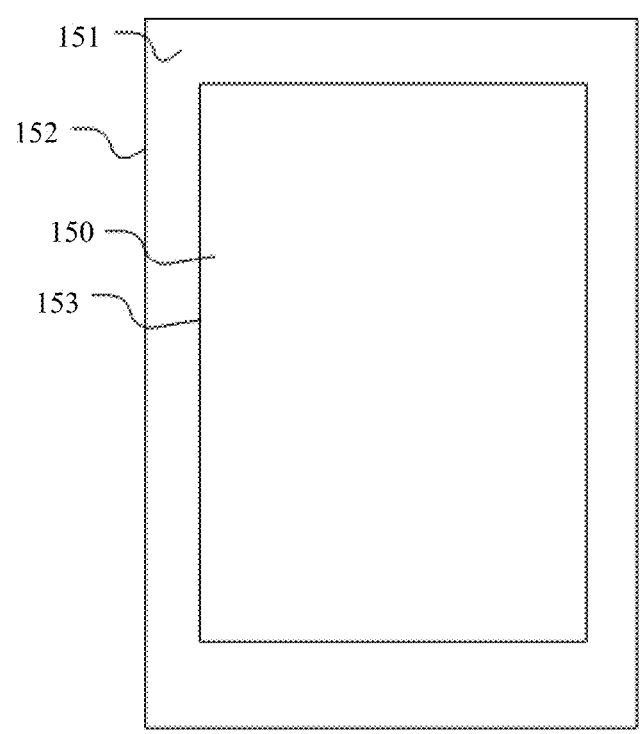
FIG. 4 is a schematic diagram of arrangement of a first display screen and a second display screen according to an embodiment.

It can be understood that the second display region 151 is not limited to being disposed in a top region 121 of the mobile terminal 10, but may be disposed in another region of the mobile terminal 10. The second display region 151 and the first display region 150 may be disposed in another manner, to obtain a different display effect and improve use experience of a user. For example, FIG. 4 is a schematic diagram of arrangement of the first display screen 152 and the second display screen 153 according to an embodiment. The second display region 151 is disposed by encircling the first display region 150. Correspondingly, the first connection part 101 of the first display screen 152 is disposed by encircling the second connection part 102. The second display screen 153 is attached to the second connection part 103, to form the ring-shaped second display region 151. In the mobile terminal 10, virtual keys are disposed in regions corresponding to both sides of the first display region 150.

The virtual keys, for example, special functional keys such as a volume key and an on/off key, are covered by the second display region 151. Alternatively, a strobe light may be disposed. The strobe light is covered by the second display region 151. When the mobile terminal 10 is in a photographing scenario, the strobe light turns on, to improve brightness of ambient light and therefore improve photographing/video recording quality and user experience. In the second display region 151 corresponding to a bottom of the first display region 150, a user can see an internal device of the mobile terminal 10.

In an embodiment, a rigid display screen, for example, a rigid OLED display screen, AMOLED, or an LCD display screen, may be used as the second display screen 153. It can be understood that the area of the first connection part 101 may alternatively be larger than or equal to the area of the second connection part 103.

With reference to FIG. 2, the display module 15 further includes a transparent cover 155, to protect the first display screen 152 and the second display screen 153. The transparent cover 155, the first display screen 152, and the second display screen 153 are sequentially disposed in an overlay manner. The transparent cover 155 is disposed on an outermost side of the mobile terminal 10. The transparent cover 155 is made of glass. It can be understood that the transparent cover 155 may be alternatively made of another transparent material, for example, transparent plastic.

Further, with reference to FIG. 2, the display module 15 further includes a first optical clear adhesive layer 157 and a second optical clear adhesive layer 159. The first display screen 152 is attached to the transparent cover 155 by using the first optical clear adhesive layer 157. The second display screen 153 is attached to a side, of the first display screen 152, away from the transparent cover 155 by using the second optical clear adhesive layer 159. In other words, the transparent cover 155, the first optical clear adhesive layer 157, the first display screen 152, the second optical clear adhesive layer 159, and the second display screen 153 are sequentially disposed in an overlay manner.

Further, the enclosure 11 is fully transparent or partially transparent. The second display region 151 of the display module 15 is disposed in correspondence to a transparent part of the enclosure 11. The enclosure 10 may be formed by using a plastic, metal, or composite material, or another appropriate material, or any combination thereof.

It can be understood that at least some structures of a region, of the mobile terminal 10, corresponding to the second display region 151 are transparent structures, so that a user can see, from the front side 12 through the second display region 150, a real object in the real world on a side corresponding to the rear side of the mobile terminal 10. In other words, the region, of the mobile terminal 10, corresponding to the second display region 151 is transparent, instead of being restricted to that the second display region 151 of the display module 15 is transparent. Light can pass from the second display region 151 of the mobile terminal 10 through a side, of the enclosure 11, away from the display module 15. For example, the region, of the mobile terminal 10, corresponding to the second display region 151, a structure between the display module 15 and the enclosure 11, and a region, of the enclosure 11, corresponding to the second display region 151 are all transparent.

Further, still referring to FIG. 1A, the second display region 151 is located in the top region 121 of the mobile terminal 10. The second display region 151 is distributed in the entire top region 121. For example, the second display region 151 includes a first transparent sub-region 1511 and a second transparent sub-region 1513 that are mutually connected. It can be understood that all structures of the mobile terminal 10 distributed in the second display region 151 are transparent structures, or no structure is disposed.

The one or more devices 22 are disposed between the display module 15 and the enclosure 11. The second transparent sub-region 1513 of the display module 15 covers at least one device 22. In other words, at least one of the one or more devices 22 is disposed between the display module 15 in the second transparent sub-region 1513 and the enclosure 11. In this implementation, the one or more devices 22 include an optical transmitter 221, a sensor 222, an indicator 223, and a camera 224, to implement a plurality of functions of the mobile terminal 10. The optical transmitter 221, the sensor 222, the indicator 223, and the camera 224 are all disposed in correspondence to the second transparent sub-region 1513, to transmit and/or receive an optical signal through the display module 15. For example, the sensor 222 senses light brightness of an environment in which the mobile terminal 10 is located, and adjusts display brightness of the display module 15. Details are not described herein for the sake of brevity. It can be understood that there may be one device 22, or the devices 22 may alternatively include another component, for example, a flash.

Further, a screen sound production technology is used for the display module 15 of the mobile terminal 10, that is, the mobile terminal 10 does not need to additionally provide an earpiece hole or an earpiece structure on the display module 15. It can be understood that an earpiece may be alternatively disposed between the display module 15 and the enclosure 11, and an earpiece hole is provided in a side wall of the enclosure 11.

The first display region 150 and the second display region 151 can simultaneously display information of the mobile terminal 10, or may provide display according to different application requirements, to adapt to a user requirement. For example, referring to FIG. 1B, when the first display region 150 displays a desktop, the second display region 151 displays information such as time, a network signal, weather, and a battery capacity (usually a status of the mobile terminal 10). The devices 22 are hidden behind the second display region 151. When a user watches a video by using the first display region 150, the second display region 151 may enter a screen-off state to save power. When the mobile terminal 10 is in a standby state but the user needs to use the mobile terminal 10 to view the time or information, the second display region 151 enters a screen-on state, and the first display region 150 enters a screen-off state. This facilitates use of the user while saving power of the mobile terminal 10. Further, a part of or all of the second display region 151 may provide display. Referring to FIG. 1C, for example, in a photographing scenario of the mobile terminal 10, a processor (not shown in the figure) of the mobile terminal 10 controls the first transparent sub-region 1511 to enter a screen-on state and display information, the second transparent sub-region 1513 is in a transparent state, and the devices 22 are shown in the second display region 151, without affecting a photographing function of the camera located in the second transparent sub-region 1513.

Figure 1D:
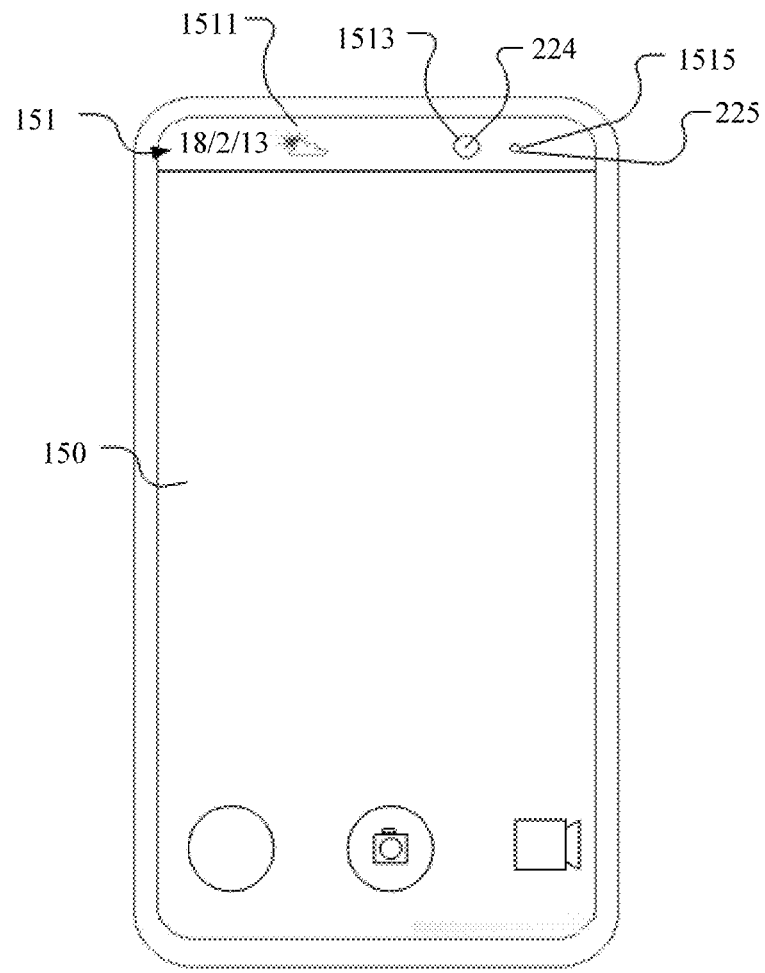
FIG. 1D is a diagram of a display interface of a mobile terminal according to an embodiment.

In an embodiment, referring to FIG. 1D, the second display region 151 includes a first transparent sub-region 1511, a second transparent sub-region 1513, and a third transparent sub-region 1515. The second transparent sub-region 1513 and the third transparent sub-region 1515 are encircled by the first transparent sub-region 1511. A device 224 is disposed in correspondence to the second transparent sub-region 1513. The third transparent sub-region 1515 is disposed in correspondence to the third transparent sub-region 1515. In this embodiment, the device 224 is a camera, and the device 225 is a flash. In a photographing scenario of the mobile terminal 10, a processor (not shown in the figure) of the mobile terminal 10 controls the first transparent sub-region 1511 to enter a screen-on state and display information, the second transparent sub-region 1513 is in a light transmission state (namely, a transparent state), the device 224 is shown in the second transparent sub-region 1513, without affecting a photographing function of the camera located in the second transparent sub-region 1513, and the device 225 is shown in the third transparent sub-region 1515, without affecting a photographing function of the flash located in the third transparent sub-region 1515.

According to the mobile terminal 10 provided in the first implementation, at least one transparent display region is disposed, so that the information of the mobile terminal 10 can be displayed, and the devices 22 disposed under the region are allowed to transmit and receive an optical signal through the display module 15. The mobile terminal 10 integrates non-transparent display and transparent display functions. A surface region of a device, of the mobile terminal, that requires light transmission is properly disposed, and a screen-to-body ratio for display on the mobile terminal is increased, to implement a full-screen display effect. In addition, a display effect is enriched, and user experience is improved.

In addition, the first display region 150 and the second display region 151 of the display module 15 are distributed in an entire region of the front side 12 of the mobile terminal 10, thereby implementing a high screen-to-body ratio and improving use experience of a user. The devices 22 are disposed between the display module 15 and the enclosure 11, and the display module 15 does not need to reserve space (for example, by using a structure such as a via or a groove) for the devices 22. This ensures the devices 22 while improving a display effect of the display module 15, use experience of a user, and reliability of the display module 15.

In addition, in the prior art, a transparent screen is usually used to implement a transparent display function of a mobile terminal. However, the transparent screen has a small quantity of pixels, a low resolution, a relatively low color contrast, and a relatively poor display effect, and therefore cannot meet a user requirement for high-resolution display. In comparison, the mobile terminal 10 provided in the first implementation includes the first display screen 152 and the second display screen 153, the first display screen 152 is a transparent display screen, and the second display screen 153 used as a primary display may be made of a flexible screen with a relatively high resolution. This helps improve a display resolution, a color contrast, and the like of the mobile terminal 10, and helps improve a display effect of the mobile terminal 10.

Further, because the transparent cover 155, the first display screen 152, and the second display screen 153 are sequentially disposed in an overlay manner, the first connection part 101 of the first display screen 152 implements a local transparent effect, thereby improving a function of the mobile terminal 10 and also improving user experience.

Furthermore, the display module 15 is formed by the first display screen 152 and the second display screen 153 that are overlaid, and the area of the second display screen 153 is smaller than the area of the first display screen 152. Therefore, a structure may be disposed in idle space of the transparent display 151.

It can be understood that the first display screen 152 may be alternatively a flexible display screen.

It can be understood that the display module 15 is not limited to being disposed on the front side 12 of the mobile terminal 10, but may be alternatively disposed on the rear side or a lateral side of the mobile terminal 10. There may be two or more display modules 15. For example, one display module 15 is disposed on the front side 12 of the mobile terminal 10, and the other display module 15 is disposed on the rear side of the mobile terminal 10, to implement two-side display or multi-side display.

It can be understood that the transmittance of the material of the second display region 151 is 50%-99%, for example, 60%, 80%, 90%, or 95%.

It can be understood that there may be more than one second display region 151, and there may be more than one first display region 152. For example, there are two first connection parts 101 and one second connection part 103, the second connection part 103 is connected between the two first connection parts 101, and the second display screen 153 is attached to the second connection part 103.

It can be understood that the second display region 151 is a semi-transparent display region. In the mobile terminal, a flexible screen with a higher resolution is attached under a semi-transparent screen, to keep a transparent display effect in a local region through overlay fitting of the two screens. This solution can keep a transparent display region while meeting a user requirement for high-resolution display.

In some embodiments, an optical clear adhesive (OCA) is first used to attach a transparent screen under cover glass of a display device panel, and then a layer of OCA is used to attach a normal flexible screen under the transparent screen. It is ensured that a display area of the transparent screen is larger than an area of the normal flexible screen. A transparent display region is placed at a top location of a mobile phone, a front camera and a sensor are placed beneath to implement a function such as photographing, and a piezoelectric device is used for screen sound production, to implement a full-screen display effect.

It can be understood that the display module 15 may further include a touch part (not shown in the figure) for a user to perform a touch input operation. This facilitates use.

Figure 5:
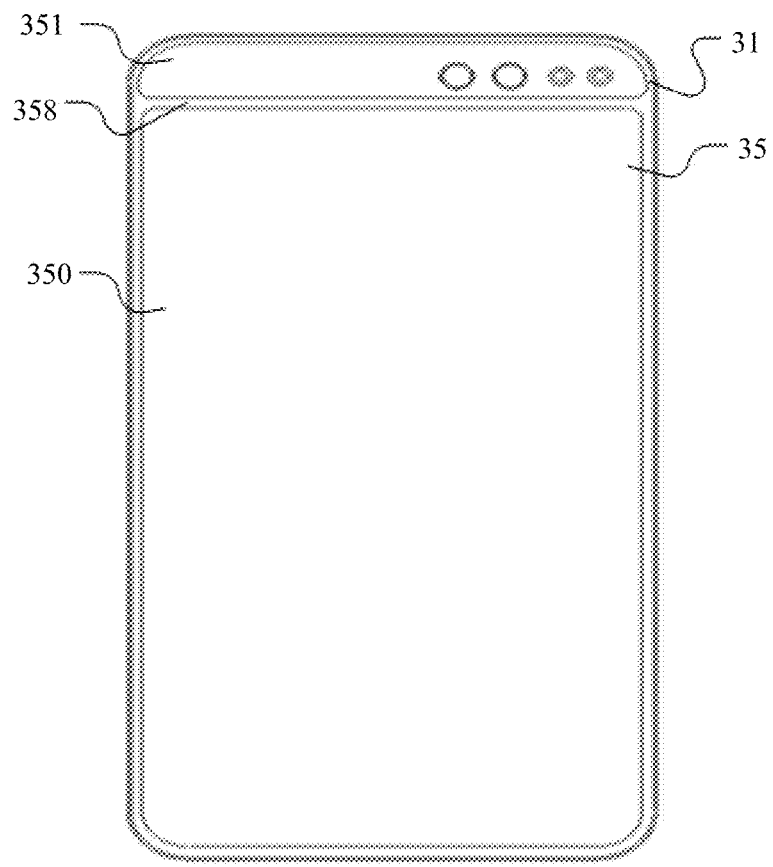
FIG. 5 is a schematic diagram of a mobile terminal according to an embodiment.

FIG. 5 is a schematic diagram of a mobile terminal 30 according to a second implementation. A structure of the mobile terminal 30 is roughly the same as that of the mobile terminal 10 provided in the first implementation. A display module 35 is disposed in the enclosure 31. A difference lies in that the display module 35 includes a first display region 350 and a second display region 351 disposed with a spacing from the first display region 350.

Figure 6:
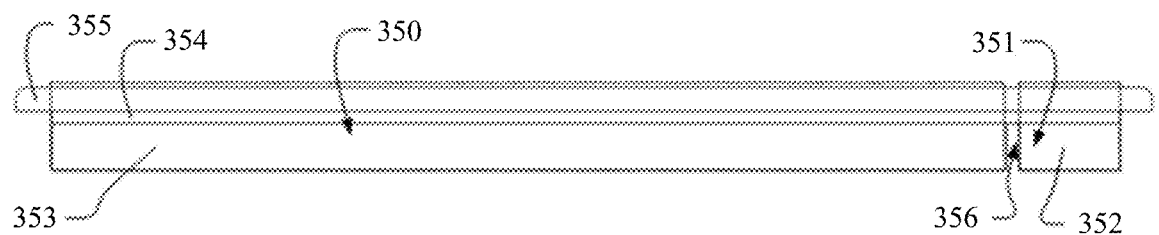
FIG. 6 is a side view of a display module according to an embodiment.

FIG. 6 is a side view of the display module 35 according to the second implementation. The display module 35 includes a first display screen 352, a second display screen 353, and a transparent cover 355. A difference of the mobile terminal 30 from the mobile terminal 10 lies in that the first display screen 352 and the second display screen 353 are spliced to form a complete display interface, and both the first display screen 352 and the second display screen 353 are disposed on the transparent cover 355. The first display screen 352 is a transparent display screen used for transparent display. The first display screen 352 is disposed in correspondence to the second display region 351. The second display screen 353 is disposed in correspondence to the first display region 350. In other words, a region, of the display module 35, corresponding to the first display screen 352 forms the second display region 351, and a region, of the display module 35, corresponding to the second display screen 353 forms the first display region 350. In this implementation, the first display screen 352 and the second display screen 353 are attached to the transparent cover 355 by using an optical clear adhesive layer 354.

Further, the first display screen 352 and the second display screen 353 are disposed with a spacing to form a gap 356. The gap 356 is a gap reserved for a fitting process, so as to route a wire and/or fill an adhesive. A region, on the transparent cover 355, corresponding to the gap 356 forms a blocking region 358 configured to block the gap 356, so as to improve a degree of beauty of the mobile terminal 30 and therefore improve use experience of a user. In this implementation, the region, on the transparent cover 355, corresponding to the gap 356 is printed with ink to form a blocking region 358. The first display region 350 is disposed with a spacing from the second display region 351. In other words, a region, of the mobile terminal 30, in which the blocking region 358 is located is a non-display region.

According to the mobile terminal 30 provided in the second implementation, the first display screen 352 and the second display screen 353 are horizontally attached to the transparent cover 355 side by side, and the first display screen 352 is a transparent display screen. This implements a local transparent display function of the mobile terminal 30 while reducing a thickness of the mobile terminal 30 and also reducing component costs and fitting costs of the mobile terminal 30.

According to the display module 15 provided in the first implementation and the display module 35 provided in the second implementation, the first display region is disposed in a connection to the second display region, and/or the first display region is disposed with a spacing from the second display region.

A quantity of display screens of the display module 35 is not limited to two, and may be more than two. In an embodiment, the display module 35 includes more than two display screens. One display screen is a transparent display screen. The transparent display screen is located between other two display screens, to form one second display region and two first display regions. The second display region is located between the two first display regions. In other words, the display module includes at least two display screens, and the at least two display screens are mutually spliced.

The transparent cover is first completely attached to the transparent screen by using a first layer of transparent adhesive, and then is attached to a conventional flexible screen by using a second layer of transparent adhesive. A display area of the transparent screen is larger than an area of a display region of the conventional flexible screen. This can implement a local transparent effect of the transparent screen, and implement a full-screen solution characterized by transparency.

A conventional flexible screen and a transparent screen are attached to a cover lens. The two screens are horizontally placed side by side. A fitting gap needs to be reserved between the two screens as a non-display region.

On the CG, the transparent screen is attached to the conventional flexible screen by using a layer of OCA adhesive. A processing gap needs to be reserved between the two screens. In appearance, ink needs to be silkscreened on the CG for blocking. A final effect is that a transparent small screen is on the top, printing ink is in the middle for blocking, and a normal flexible screen is at the bottom. Advantages of this solution lie in that a thickness is reduced, device costs of a transparent screen are reduced, and fitting costs are reduced.

Figure 7:
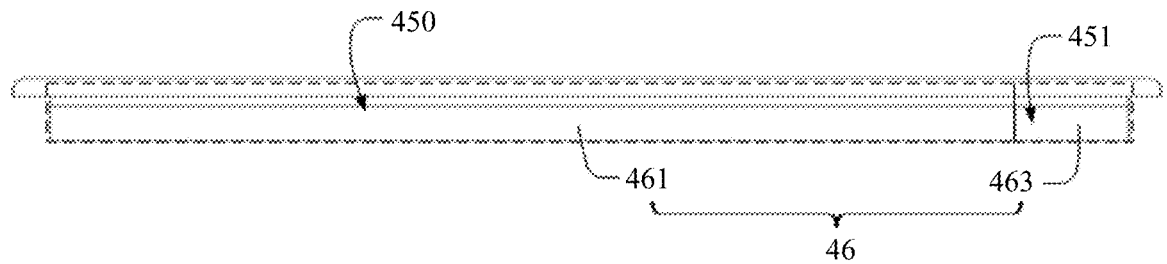
FIG. 7 is a side view of a display module according to another embodiment.

FIG. 7 is a side view of a display module 45 according to a third implementation. The display module 45 includes a first display region 450 and a second display region 451. The first display region 450 is disposed in a connection to the second display region 451.

Figure 8:
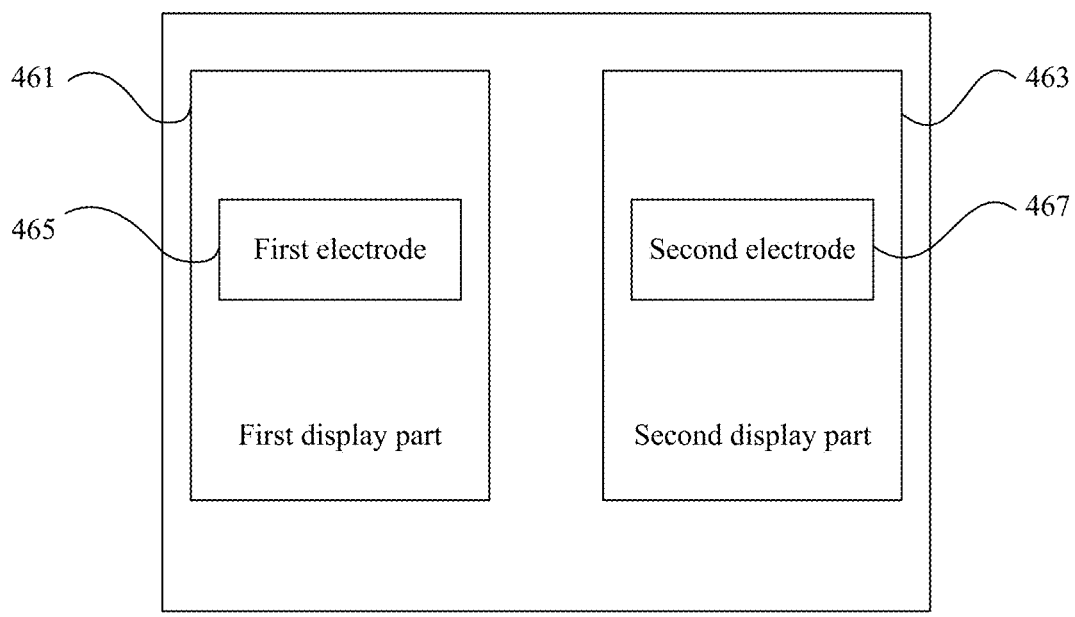
FIG. 8 is a structural block diagram of a display screen according to an embodiment.

A difference lies in that the display module 45 includes one display screen 46. The display module 46 includes a first display part 461 and a second display part 463 disposed in a connection to the first display part 461. The first display part 461 is disposed in correspondence to the first display region 450. The second display part 463 is disposed in correspondence to the second display region 451, and is used for transparent display. The second display part 463 is made of a light-transmissive material. FIG. 8 is a structural block diagram of the display screen 46 according to the third implementation. The first display part 461 includes a plurality of first electrodes 465. The second display part 463 includes a plurality of second electrodes 467. Transmittance of the first electrode 465 is greater than transmittance of the second electrode 467. Therefore, the display module 45 presents different display effects in the first display region 450 and the second display region 451. In this implementation, the display screen 46 is a flexible display screen.

In the third implementation, the first electrode 465 is made of at least one of graphene, a carbon nanotube, and a silver nanowire. The graphene, the carbon nanotube, and the silver nanowire have high transmittance. For example, the graphene material can transmit about 98% of light. This can greatly improve transparency of the display module 45 in the second display region 451, so that the second display region 451 of the display module 45 has a quite good transparent display effect. The second electrode 467 is made of a traditional indium tin oxide material.

Different display effects are implemented on one screen, a display region of a conventional flexible screen is made of the conventional ITO (indium tin oxide) material, and a transparent electrode in a transparent display region is made of a transparent material such as the graphene, the carbon nanotube, or the silver nanowire, to implement a full-screen solution with local transparency. Different display effects of transparency and non-transparency are implemented on one screen by regions, and the entire screen is attached to a transparent cover by using a layer of optical clear adhesive, to implement a full-screen effect with local transparency.

Figure 9A:
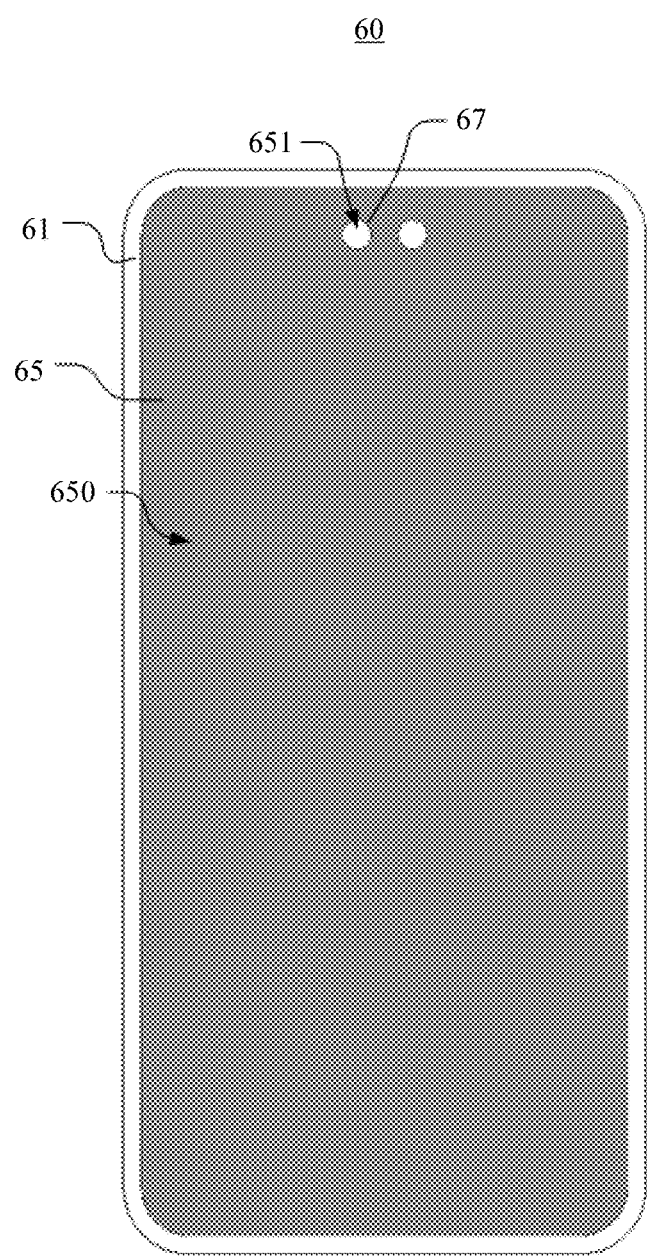
FIG. 9A is a schematic diagram of a mobile terminal according to another embodiment.
Figure 9B:
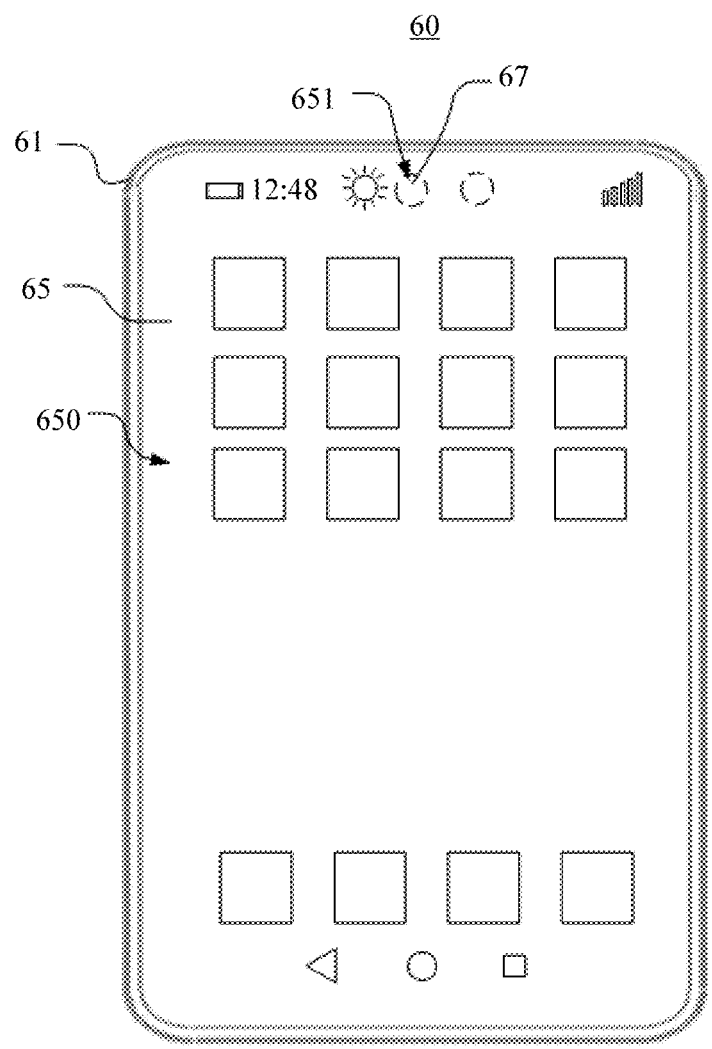
FIG. 9B is a schematic diagram of a display interface of the mobile terminal shown in FIG. 9A.

FIG. 9A is a schematic diagram of a mobile terminal 60 according to a fourth implementation. FIG. 9B is a schematic diagram of a display interface of the mobile terminal 60 shown in FIG. 9A. The mobile terminal 60 includes an enclosure 61, a display module 65, and two devices 67. A structure of the display module 65 is roughly the same as that of the display module 45 provided in the third implementation. The display module 65 is disposed in the enclosure 61. The display module 65 includes one first display region 650 and two second display regions 651. The two second display regions 651 are encircled by the first display region 650. The second display regions 651 are located in a top region (not marked in the figure) of the mobile terminal 60. Each device 67 is disposed in correspondence to one second display region 651, and is located between the display module 65 and the enclosure 61. In other words, in the display module 65, one second display region 651 is disposed in correspondence to each device 67. Both the devices 67 are located on a side, of the display module 65, adjacent to a rear side of the enclosure 61, that is, behind the second display regions 651 of the display module 65. In this implementation, one device 67 is a front camera, and the other device 67 is an indicator.

In another embodiment, it is not restricted that the second display regions 651 are encircled by the first display region 650 or the devices 67 are disposed behind the second display regions 651 of the display module 65.

According to the mobile terminal 60 provided in the fourth implementation, the second display regions 651 are encircled by the first display region 650, and the devices 67 are arranged in a region, of the mobile terminal 60, corresponding to the second display regions 651. This helps increase a screen-to-body ratio of the mobile terminal 60 and implement a full-screen solution with local transparency.

In an embodiment, a passive matrix organic light-emitting diode (PMOLED)-driven display mode is used for the second display regions 651, to implement local transparent display while saving power.

In an embodiment, an AMOLED-driven display mode with a relatively low resolution is used for the second display regions 651, to implement local transparent display while saving power.

In an embodiment, the second display regions 651 include sub-regions. The sub-regions are disposed in correspondence to the devices 67. No pixel is set in the sub-regions. A material corresponding to the sub-regions is made of a light-transmissive material. The sub-regions do not have a display function. A pixel is set in a region other than the sub-regions of the second display regions 651, that is, the region has a display function.

In an embodiment, no pixel is set in the second display regions 651. A material of the second display regions 651 is made of a transparent material. In other words, the second display regions 651 do not have a display function, and a user can see a device behind the second display regions 651 through the second display regions 651.

Different display effects are implemented on one screen, a display region of a conventional flexible screen is made of a conventional ITO material, and a transparent electrode in a local transparent display region is made of a transparent material such as graphene, a carbon nanotube, or a silver nanowire, to implement a full-screen solution with local transparency.

A local region in the first display region is made of a transparent material, and a key device such as a camera is arranged under the second display regions.

Figure 10A:
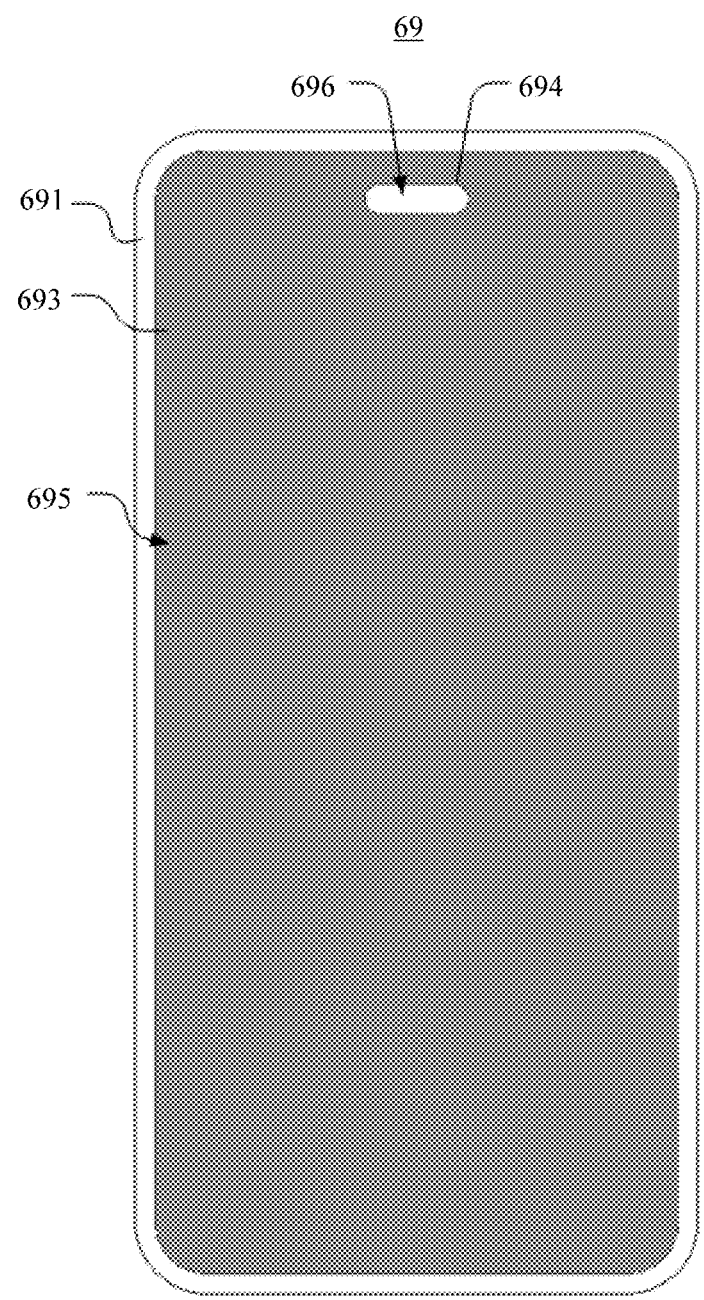
FIG. 10A is a schematic diagram of a mobile terminal according to an embodiment.
Figure 10B:
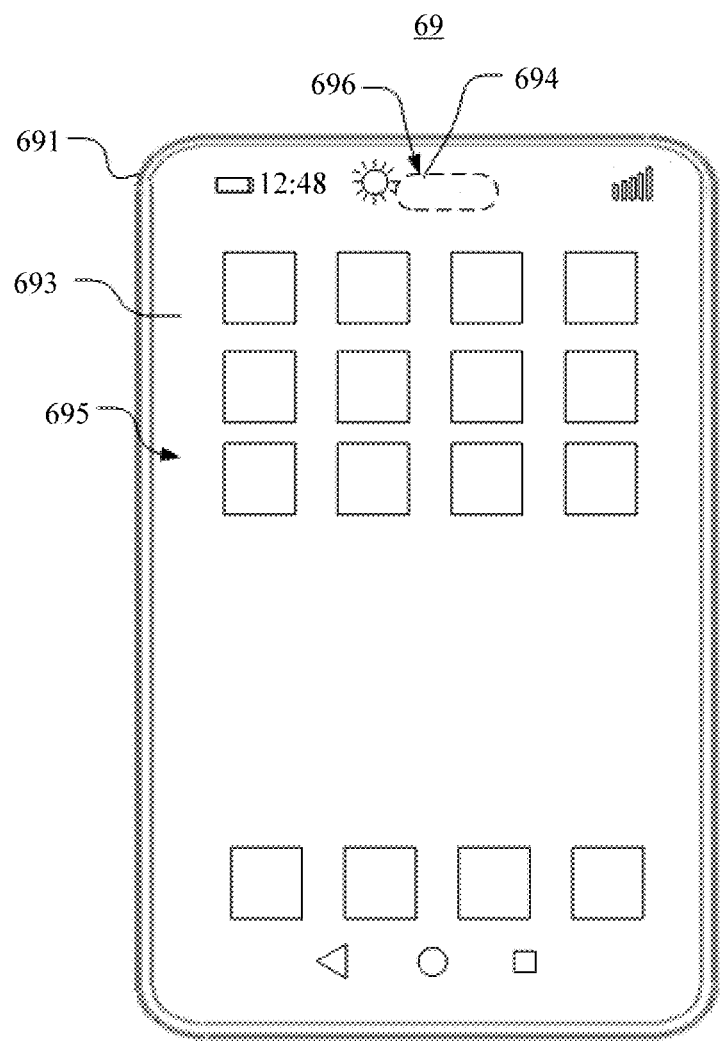
FIG. 10B is a schematic diagram of a display interface of the mobile terminal shown in FIG. 10A.

In an embodiment, FIG. 10A is a schematic diagram of a mobile terminal 69 according to an embodiment, and FIG. 10B is a schematic diagram of a display interface of the mobile terminal 69 shown in FIG. 10A. The mobile terminal 69 includes an enclosure 691, a display module 693, and a device 694. The display module 693 is disposed in the enclosure 691. The display module 693 includes a first display region 695 and a second display region 696 disposed in a connection to the first display region 695. The first display region 695 is disposed by encircling the second display region 696. The second display region 696 is disposed in correspondence to a location of the device 694. The first display region 695 and the second display region 696 are located on a same display screen. The device 694 is located between the display module 693 and the enclosure 691. No pixel is set and no wire is routed in the second display region 696. A material of the second display region 696 is made of a light-transmissive material to implement transparency, so as to show the device 694 without affecting a function of the device 694. Because of the second display region 696, no slotted structure such as a via needs to be provided on the display module 693 to reserve space for the device 694, thereby implementing a full-screen solution with local transparency.

Figure 11:
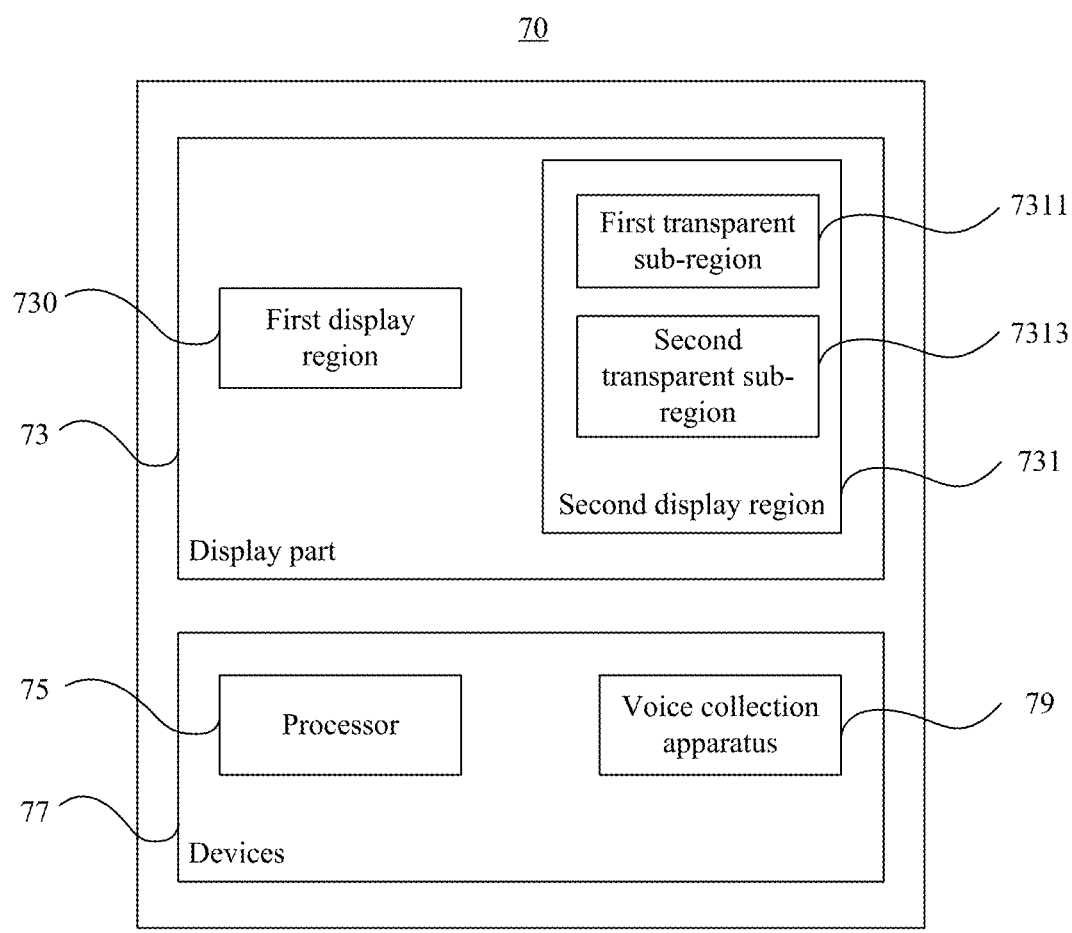
FIG. 11 is a structural block diagram of a mobile terminal according to another embodiment.
Figure 12A:
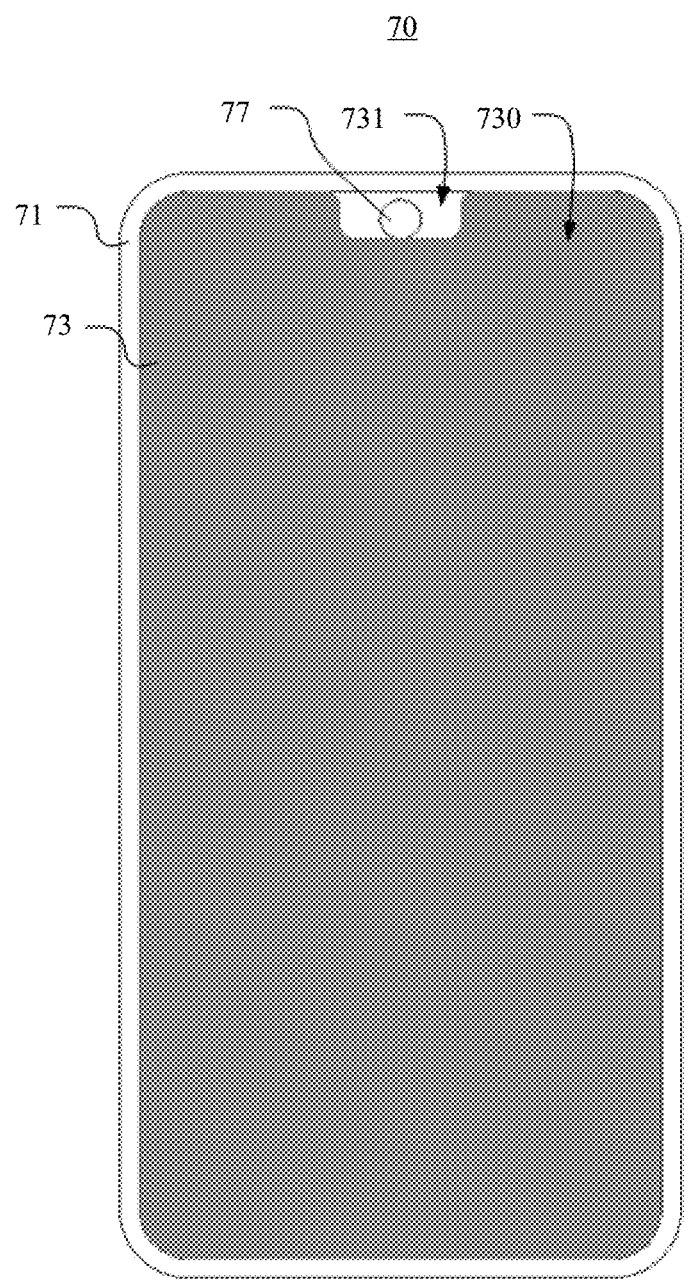
FIG. 12A is a schematic diagram of a mobile terminal in a first use scenario according to another embodiment.

FIG. 11 is a structural block diagram of a mobile terminal 70 according to a fifth implementation. FIG. 12A is a schematic diagram of the mobile terminal 70 according to the fifth implementation. The mobile terminal 70 includes an enclosure 71 (shown in FIG. 12A), a display module 73, and one or more devices 77. The display module 73 may be one of the display module 15 provided in the first implementation, the display module 35 provided in the second implementation, the display module 45 provided in the third implementation, and the display module 65 provided in the fourth implementation. The display module 73 includes a first display region 730 and a second display region 731. At least one of the one or more devices 77 is disposed between the display module 73 in the second display region 731 and the enclosure 71.

The mobile terminal 70 includes different statuses. For example, in a first status, the display module 73 displays information of the mobile terminal 70 in the first display region 730 and the second display region 731, in other words, the display module 73 enters a screen-on state for display in both the first display region 730 and the second display region 731; and in a second status, the display module 73 do not display information of the mobile terminal 70 in at least a part of the second display region 731, so that the devices 70 disposed under the second display region 731 transmit and/or receive an optical signal through the display module 73 in the second display region 731.

For example, when the mobile terminal 70 lights up a screen and displays a home screen, the display module 73 displays the information of the mobile terminal 70, for example, a background of the home screen, an application icon, and a reminder icon, in the first display region 730 and the second display region 731. When the mobile terminal 70 performs photographing by using a front camera disposed under the display module 73 in the second display region 731, the second display region 731 does not display information, and is in a light transmission state (a transparent state), so that the front camera can capture an image. The captured image may be displayed in the first display region 730.

The one or more devices 77 further include at least one processor 75. The at least one processor 75 is configured to control and adjust a work status of the display module 73 in the first display region 730 and a work status of the display module 73 in the second display region 731.

Both the display module 73 and the one or more devices 77 are disposed in the enclosure 71. The processor 75 is electrically connected to the display module 73 and the other devices 77.

The processor 75 can control at least one of the first display region 730 and the second display region 731 for display. The processor 75 can control the first display region 730 and the second display region 731 for simultaneous display, or may control display according to different application requirements, to adapt to a user requirement. The first display region 730 serves as a primary display region of the mobile terminal 70. The second display region 731 serves as a status display bar of the mobile terminal 70 for displaying information such as time, a network signal, weather, and a battery capacity.

For example, the mobile terminal 70 includes different use scenarios. Based on different use scenarios, the processor 75 controls and adjusts the work status of the display module 73 in the first display region 730 and the work status of the display module 73 in the second display region 731, so as to adjust a status of the mobile terminal 70. In this implementation, the work status includes screen-on display and screen-off.

Figure 12B:
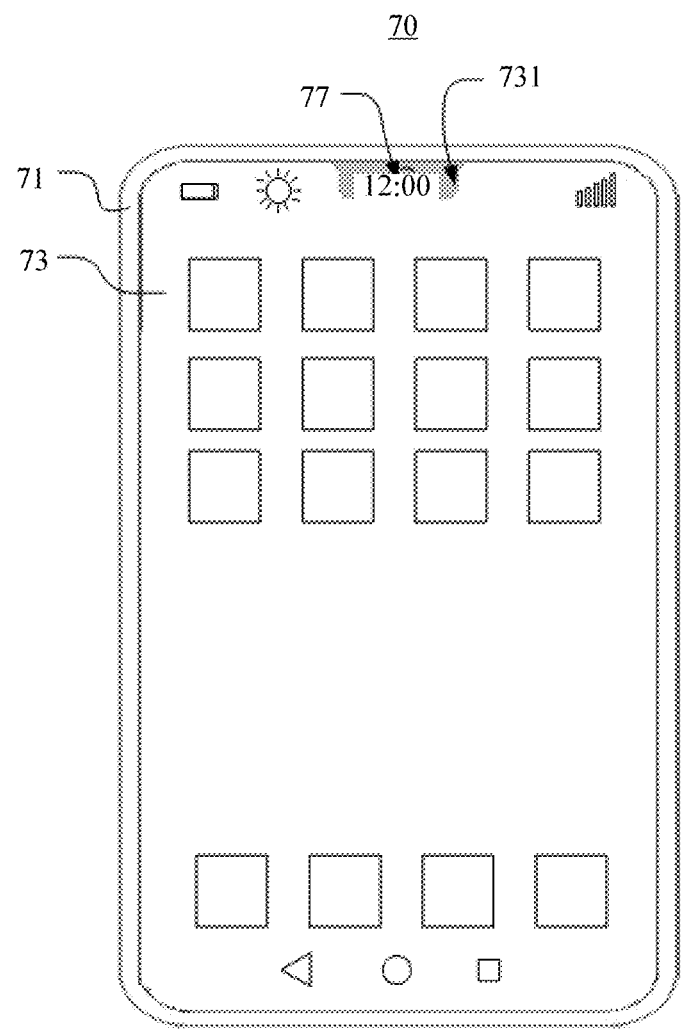
FIG. 12B is a schematic diagram of a mobile terminal in a second use scenario according to an embodiment.
Figure 12C:
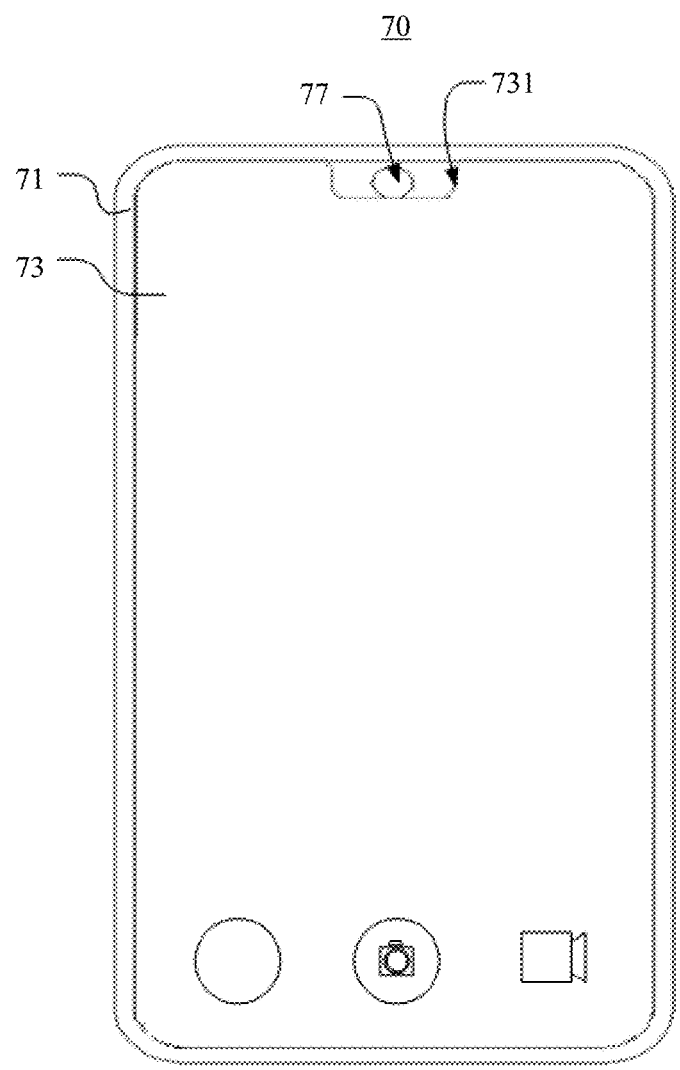
FIG. 12C is a schematic diagram of a mobile terminal in a third use scenario according to an embodiment.
Figure 12D:
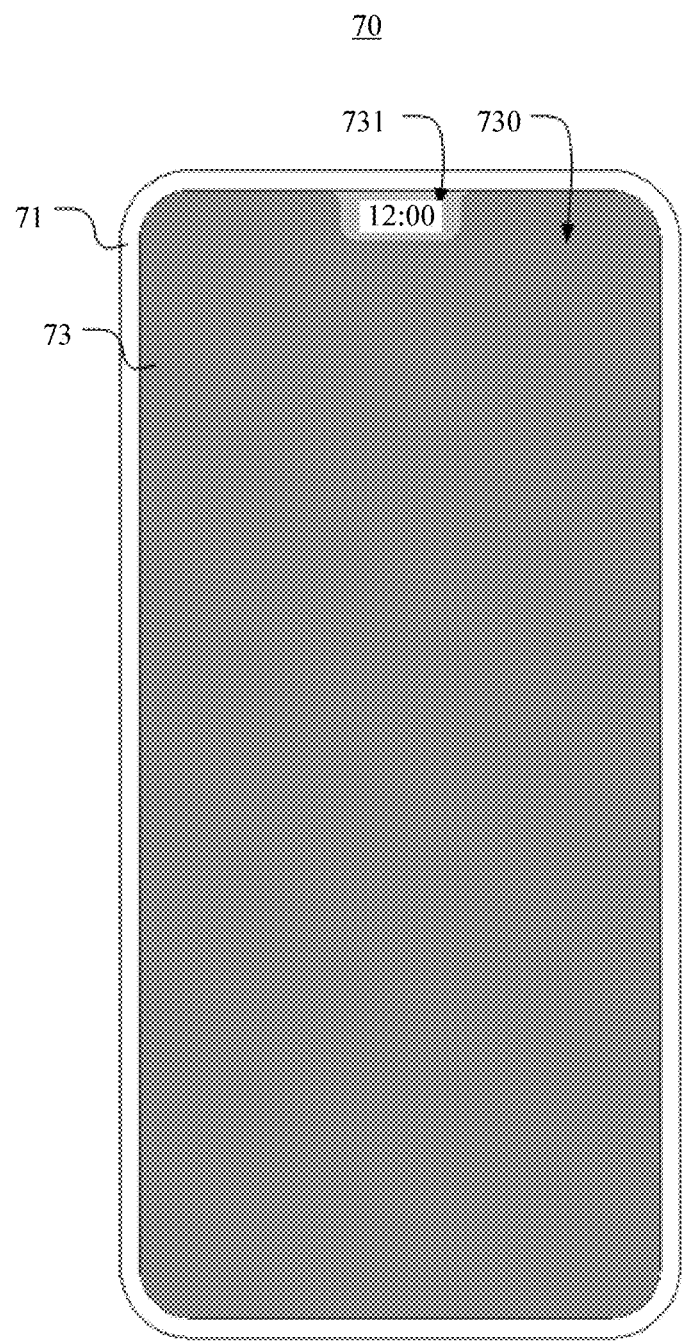
FIG. 12D is a schematic diagram of a mobile terminal in a fourth use scenario according to an embodiment.

The use scenarios include a first use scenario, a second use scenario, a third use scenario, a fourth use scenario, and so on. For example, when the mobile terminal 70 is in the first use scenario, referring to FIG. 12A, both the first display region 730 and the second display region 731 are in a screen-off state, for example, the mobile terminal 70 is in a standby state. Referring to FIG. 12B, when the mobile terminal 70 is in the second use scenario (in the first status), both the work status of the display module 73 in the first display region 730 and the work status of the display module 73 in the second display region 731 are screen-on display, and when the first display region 730 displays an interface (for example, the home screen or a website interface), the second display region 731 displays the status (the information such as the time, the network signal, the weather, and the battery capacity) of the mobile terminal 70. When the mobile terminal 70 is in the third use scenario (in the second status), the display module 73 is in a screen-on display state in the first display region 730, and the display module 73 is in a screen-off state in the second display region 731. For example, in a use scenario of photographing, the second display region 731 is in a screen-off state, without affecting use of the devices 77. Referring to FIG. 12D, when the mobile terminal 70 is in the fourth use scenario, the work status of the display module 73 in the first display region 730 is screen-off, and the work status of the display module 73 in the second display region 731 is screen-on display, for example, the time is displayed.

For another example, when the mobile terminal 70 is in the standby state but a user needs to use the mobile terminal 70 to view the time or information, the second display region 731 is triggered to enter the screen-on state. This facilitates use of the user when the first display region 730 is still in the screen-off state while saving power of the mobile terminal 70. In other words, the processor 75 controls the mobile terminal 70 to switch from the fourth operating mode to the third use scenario, that is, the processor 75 controls and adjusts the work status of the second display region 731 based on different use scenarios.

Further, in response to a trigger event, the processor 75 controls the second display region 731 to switch from a display state to a transparent state. In other words, when the trigger event occurs, the mobile terminal 70 can switch a use scenario. In the transparent state, the second display region 731 of the display module 73 is in a light transmission state, and the second display region 731 is usually in a screen-off state. When the second display region 731 is in the transparent state, a structure or an object located on the other side of the transparent region 731 of the display module 73 is shown on the mobile terminal 70. At least one of the one or more devices 77 can transmit and/or receive an optical signal through the display module 73, without affecting use of a function of the at least one device 77.

FIG. 12D is a schematic diagram when the display module 73 of the mobile terminal 70 provided in the fifth implementation is in another work status (a display status) in the second display region 731. In this implementation, when being in a screen-on display state, the second display region 731 of the mobile terminal 70 is in a semi-transparent display state. In the semi-transparent display state, the second display region 731 of the display module 73 is in a semi-transparent state, and the second display region 731 of the display module 73 is usually lit up, that is, in a screen-on state. When the second display region 731 is in the semi-transparent display state, a structure or an object located on the other side of the display module 73 cannot be shown. For example, the devices 77 are hidden by the second display region 731, and a user cannot see the devices 77 through the second display region 731. When the second display region 731 is in the semi-transparent display state, the second display region 731 can display an image such as time and weather.

The trigger event may be but is not limited to the following: A function of the devices 77 disposed in the second display region 731 is enabled or disabled, for example, a switching time is preset, where when the preset switching time arrives, the processor 75 controls the display module 73 to switch from the semi-transparent display state to the transparent state or switch from the transparent state to the semi-transparent display state in the second display region 731; or the display module 73 has a touch function, where when a user taps the second display region 731, the processor 75 controls the second display region 731 to switch a display status; or another trigger event that can trigger the second display region 731 to switch a display status.

In the fifth implementation, at least one of the devices 77 that is disposed between the display module 73 in the second display region 731 and the enclosure 71 is a front camera. When the second display region 731 of the display module 73 is lit up and no function of the front camera is enabled, a user cannot see the front camera through the second display region 731. When a function, such as a photographing function, of the front camera is enabled, the second display region 731 switches from the semi-transparent display state to the transparent state, the front camera is shown on the mobile terminal 70, the display module 73 displays an image on the first display region 730, and the user may take a selfie or the like by using the front camera. In another embodiment, the devices 77 may include at least one of an indicator, a flash, a camera, an optical transmitter, and a sensor.

Further, the second display region 731 includes at least two transparent sub-regions. Based on different use scenarios of the mobile terminal 70, a work status of the display module 73 in the transparent sub-regions is controlled and adjusted to facilitate use of a user. For example, the second display region 731 includes a first transparent sub-region 7311 and a second transparent sub-region 7313 disposed in a connection to the first transparent sub-region 7311. At least one device 77 is disposed in correspondence to the second transparent sub-region 7313. The processor 75 controls the first transparent sub-region 7311 to display information, but the second transparent sub-region 7313 is in a screen-off transparent state. The device disposed in correspondence to the second transparent sub-region 7313 transmits and/or receives an optical signal through the display module 73. For example, the front camera is disposed in correspondence to the second transparent sub-region 7313. When the function of the front camera is enabled, the second transparent sub-region 7311 switches from a display status to the transparent state, the first transparent sub-region 7311 provides display, and the front camera is shown in the second transparent sub-region 7313 of the mobile terminal 70, and transmits and/or receives an optical signal through the display module 73, so that a user can take a selfie or the like by using the front camera.

According to the mobile terminal 70 provided in the fifth implementation, the status of the display module 73 in the second display region 731 is controlled based on enabling or disabling of the function of the device 77 disposed in correspondence to the second display region 731, thereby enhancing intelligence and use convenience of the mobile terminal 70. In addition, in case of display, the second display region 731 can hide the device 77, of the mobile terminal 70, disposed behind the second display region 731, without affecting image display. In addition, when the function of the device 77 is enabled, the second display region 731 switches to the transparent state, without affecting use of the device 77. The mobile terminal 70 can implement a special effect that a perspective effect and content display appear alternately, or the like, so that the mobile terminal 70 can hide the key devices 77 such as the camera and the sensor more easily, thereby implementing a transparent full screen with a high-definition display effect.

Further, referring to FIG. 11, the devices 77 further include a voice collection apparatus 79. In a use scenario, the processor 75 identifies a voice collected by the voice collection apparatus 79, and controls the display module 73 to display an image in the second display region 731. For example, the voice collection apparatus 79 identifies "weather" based on a voice. In this case, the processor 75 controls the display module 73 to display current weather information in the second display region 731. This enhances human-computer interaction and improves use experience and convenience for a user.

In an embodiment, a PMOLED-driven display mode is used for the second display region, to implement local transparent display while saving power.

In an embodiment, an AMOLED-driven display mode with a relatively low resolution is used for the second display region, to implement local transparent display while saving power.

In an embodiment, the second display region includes a sub-region. The sub-region is disposed in correspondence to the device. No pixel is set and no wire is routed in the sub-region. A material of the sub-region is a light-transmissive material, to implement a perspective effect, that is, the sub-region does not have a display function, to avoid affecting the function of the device. A pixel is set in a region other than the sub-region of the second display region, that is, the region has a display function.

In an embodiment, different display effects are implemented on one screen, a display region of a conventional flexible screen is made of a conventional ITO material, and a transparent electrode in a local transparent display region is made of a transparent material such as graphene, a carbon nanotube, or a silver nanowire, to implement a full-screen solution with a local transparent or display region.

The second display region is disposed in a local part of the mobile terminal provided in this embodiment, and an appearance beautification design is added, so that a local transparent region can be in a semi-transparent state in which information can be displayed, or can be in a transparent state in which a hidden device such as a camera can be seen. When the front camera is used for photographing, the second display region switches to the transparent state. When the front camera is in an idle state (a standby screen appears), the region may be used as a semi-transparent display region.

An appearance effect of local transparency is implemented on an intelligent electronic device. When a front camera works, light is transmitted through a screen, and when the camera is idle, a transparent screen displays content, thereby implementing a special effect that a perspective effect and content display appear alternately, or the like. Therefore, the device can hide a component such as a camera or an optical proximity sensor more easily, thereby implementing a transparent full screen with a high-definition display effect.

An embodiment further provides a display method using the foregoing mobile terminal, including: in a first status, displaying, by the display module, information of the mobile terminal in the first display region and the second display region; and in a second status, skipping displaying, by the display module, display information of the mobile terminal in at least a part of the second display region, so that the device disposed under the second display region transmits and/or receives an optical signal through the display module in the second display region.

For example, when the mobile terminal lights up a screen and displays a home screen, the display module displays the information of the mobile terminal, for example, a background of the home screen, an application icon, and a reminder icon, in the first display region and the second display region. When the mobile terminal performs photographing by using a front camera disposed under the display module in the second display region, a region, in the second display region, corresponding to the front camera does not display information, and is in a light transmission state, so that the front camera can capture an image. The captured image may be displayed in the first display region.

According to the foregoing enclosure, display module, and one or more devices, the one or more devices further include at least one processor. The at least one processor is configured to control and adjust a work status of the display module in the first display region and a work status of the display module in the second display region.

Further, the display method further includes: in response to a trigger event, controlling, by the at least one processor, the second display region to switch from a semi-transparent display state to a transparent state.

Further, the second display region includes at least two mutually connected transparent sub-regions, and the at least one processor controls and adjusts a work status of the display module in each transparent sub-region.

Further, the one or more devices further include a voice collection apparatus, and the at least one processor identifies a voice collected by the voice collection apparatus, and controls the display module to display an image in the second display region.

The foregoing descriptions are merely exemplary implementations, but are not intended to limit protection scopes of an invention. Any variation or replacement readily figured out by a person of ordinary skill in the art within the technical scope disclosed shall fall within the protection scope. Therefore, the protection scope shall be subject to the protection scope of the claims.

The invention claimed is:

1. A mobile terminal, comprising:
an enclosure;
a display module; and
one or more devices,
wherein the display module comprises a first display region and a second display region, both the first display region and the second display region are capable of displaying information, at least one of the one or more devices is disposed between the display module in the second display region and the enclosure, and the at least one of the one or more devices is capable of transmitting and/or receiving an optical signal through the display module, and
wherein the display module comprises a first display screen and a second display screen that are disposed in an overlay manner, the first display screen is a transparent display screen, the first display screen comprises a first connection part and a second connection part disposed in a connection to the first connection part, the first connection part is located in the second display region, the second connection part is located in the first display region, and the second display screen is attached to the second connection part, and the first display screen and the second display screen are disposed with a spacing to form a gap.

2. The mobile terminal according to claim 1, wherein the display module further comprises a transparent cover, and the transparent cover, the first display screen, and the second display screen are sequentially disposed in the overlay manner.

3. The mobile terminal according to claim 1, wherein the display module comprises at least two display screens, the at least two display screens are mutually spliced to form a complete display interface, at least one display screen of the at least two display screens is the transparent display screen, and the transparent display screen is disposed in correspondence to the second display region.

4. The mobile terminal according to claim 3, wherein the at least two display screens comprise the first display screen and the second display screen, the display module further comprises a transparent cover, the first display screen and the second display screen are attached to the transparent cover side by side.

5. The mobile terminal according to claim 4, wherein a region, on the transparent cover, corresponding to the gap forms a blocking region.

6. The mobile terminal according to claim 1, wherein at least one display screen of the display module comprises a first display part and a second display part disposed in a connection to the first display part, the first display part is disposed in correspondence to the second display region and is used for a transparent display, the first display part comprises a plurality of first electrodes, the second display part comprises a plurality of second electrodes, and transmittance of the first electrode is greater than transmittance of the second electrode.

7. The mobile terminal according to claim 6, wherein a material of the first electrode comprises at least one of a graphene, a carbon nanotube, and a silver nanowire.

8. The mobile terminal according to claim 1, wherein the one or more devices comprise at least one processor, the at least one processor is electrically connected to the display module, and the at least one processor controls and adjusts a work status of the display module in the first display region and a work status of the display module in the second display region.

9. The mobile terminal according to claim 8, wherein when a trigger event occurs, the at least one processor controls the display module to switch from a first work status to a second work status in the second display region.

10. The mobile terminal according to claim 8, wherein the one or more devices further comprise a voice collection apparatus, the voice collection apparatus is disposed in the enclosure, the at least one processor is electrically connected to the voice collection apparatus, and the at least one processor identifies a voice collected by the voice collection apparatus, and the at least one processor controls the display module to display a corresponding information in the second display region.

11. The mobile terminal according to claim 8, wherein the second display region comprises at least two mutually connected transparent sub-regions, and the at least one processor is capable of controlling and adjusting a work status of the display module in each transparent sub-region.

12. The mobile terminal according to claim 1, wherein the mobile terminal is a full-screen mobile phone, a tablet computer, a reader, or a wearable device.

13. The mobile terminal according to claim 2, wherein the display module further includes a first optical clear adhesive layer and a second optical clear adhesive layer, wherein the first display screen is attached to the transparent cover by using the first optical clear adhesive layer, and the second display screen is attached to a side, of the first display screen, away from the transparent cover by using the second optical clear adhesive layer, and the transparent cover, the first optical clear adhesive layer, the first display screen, the second optical clear adhesive layer, and the second display screen are sequentially disposed in the overlay manner.

14. The mobile terminal according to claim 1, wherein the second display region includes a first transparent sub-region, a second transparent sub-region, and a third transparent sub-region, the second transparent sub-region and the third transparent sub-region are encircled by the first transparent sub-region, a camera is disposed in correspondence to the second transparent sub-region, the third transparent sub-region is disposed in correspondence to the third transparent sub-region, the display module in the first transparent sub-region is in a screen-on state and displays the information, the display module in the second transparent sub-region is in a light transmission state.

15. The mobile terminal according to claim 1, wherein:
a passive matrix organic light-emitting diode driven display mode is used for the second display region; or
an AMOLED-driven display mode with a relatively low resolution is used for the second display region.

16. A display method using a mobile terminal, wherein the mobile terminal comprises an enclosure, a display module, and one or more devices, wherein the display module comprises a first display region and a second display region, both the first display region and the second display region are capable of displaying information, at least one of the one or more devices is disposed between the display module in the second display region and the enclosure, and the at least one of the one or more devices is capable of transmitting and/or receiving an optical signal through the display module,
wherein the display module comprises a first display screen and a second display screen that are disposed in an overlay manner, the first display screen is a transparent display screen, the first display screen comprises a first connection part and a second connection part disposed in a connection to the first connection part, the first connection part is located in the second display region, the second connection part is located in the first display region, and the second display screen is attached to the second connection part, and the first display screen and the second display screen are disposed with a spacing to form a gap, wherein
the display method comprises:
in a first status, displaying, by the display module, information of the mobile terminal in the first display region and the second display region; and
in a second status, skipping displaying, by the display module, the information of the mobile terminal in at least a part of the second display region, so that the at least one of the one or more devices disposed under the second display region transmits and/or receives the optical signal through the display module in the second display region.

17. The display method according to claim 16, wherein the one or more devices comprise at least one processor, configured to control and adjust a work status of the display module in the first display region and a work status of the display module in the second display region.

18. The display method according to claim 17, wherein in response to a trigger event, the at least one processor controls the display module to switch from the first work status to the second work status in the second display region.

19. The display method according to claim 17, wherein the second display region comprises at least two mutually connected transparent sub-regions, and the at least one processor controls and adjusts a work status of the display module in each transparent sub-region.

20. The display method according to claim 17, wherein the one or more devices further comprise a voice collection apparatus, and the at least one processor identifies a voice collected by the voice collection apparatus, and controls the display module to display an image in the second display region.

* * * * *